(12) United States Patent
Geng et al.

(10) Patent No.: US 12,052,866 B2
(45) Date of Patent: Jul. 30, 2024

(54) TWO-STEP L-SHAPED SELECTIVE EPITAXIAL GROWTH

(71) Applicant: Yangtze Memory Technologies Co., Ltd., Hubei (CN)

(72) Inventors: Wanbo Geng, Wuhan (CN); Lei Xue, Wuhan (CN); Jiaqian Xue, Wuhan (CN); Xiaoxin Liu, Wuhan (CN); Tingting Gao, Wuhan (CN); Bo Huang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 833 days.

(21) Appl. No.: 17/113,662

(22) Filed: Dec. 7, 2020

(65) Prior Publication Data
US 2022/0028883 A1  Jan. 27, 2022

Related U.S. Application Data

(63) Continuation of application No. PCT/CN2020/103963, filed on Jul. 24, 2020.

(51) Int. Cl.
*H10B 43/35* (2023.01)
*H10B 41/27* (2023.01)
(Continued)

(52) U.S. Cl.
CPC .............. *H10B 43/27* (2023.02); *H10B 41/27* (2023.02); *H10B 41/35* (2023.02); *H10B 43/35* (2023.02)

(58) Field of Classification Search
CPC ........ H10B 43/27; H10B 43/35; H10B 43/50; H01L 21/0274; H01L 21/30604;
(Continued)

(56) References Cited

U.S. PATENT DOCUMENTS 8,912,053 B2   12/2014   Yoo
9,536,970 B2   1/2017    Seol et al.
(Continued)

FOREIGN PATENT DOCUMENTS

CN   111295756 A   6/2020

OTHER PUBLICATIONS

International Search Report issued Apr. 22, 2021 in PCT/CN2020/103963 4 pages.

*Primary Examiner* — Moazzam Hossain
(74) *Attorney, Agent, or Firm* — Oblon, McClelland, Maier & Neustadt, L.L.P.

(57) ABSTRACT

The present disclosure provides a method of processing a semiconductor device having a stack formed over a source sacrificial layer above a substrate, a channel structure extending vertically through the stack and the source sacrificial layer, a gate line cut trench extending vertically through the stack, and a spacer layer covering uncovered top and side surfaces of the stack. The method can include exposing a lower sidewall of the channel structure by removing the source sacrificial layer, forming a protection layer on all uncovered surfaces, exposing a channel layer of the channel structure by removing a first portion of the protection layer and an insulating layer of the channel structure, forming an initial source connection layer over the exposed channel layer, exposing the substrate by removing a second portion of the protection layer, and forming a source connection layer over the initial source connection layer and the exposed substrate.

12 Claims, 9 Drawing Sheets

(51) Int. Cl.
*H10B 41/35* (2023.01)
*H10B 43/27* (2023.01)

(58) Field of Classification Search
CPC ............. H01L 21/308; H01L 21/31111; H01L 29/1037; H01L 29/40117; H01L 29/7926; H01L 21/02636; H01L 29/66833
See application file for complete search history.

(56) References Cited

U.S. PATENT DOCUMENTS

| | | |
|---|---|---|
| 9,564,499 B2 | 2/2017 | Seol et al. |
| 9,768,266 B2 | 9/2017 | Seol et al. |
| 9,799,670 B2 | 10/2017 | Nishikawa et al. |
| 9,911,748 B2 | 3/2018 | Nishikawa et al. |
| 10,504,916 B2 | 12/2019 | Huo et al. |
| 10,903,327 B2 | 1/2021 | Seol et al. |
| 10,916,556 B1 * | 2/2021 | Sakakibara ............ H10B 43/35 |
| 2011/0233648 A1 | 9/2011 | Seol et al. |
| 2013/0234234 A1 | 9/2013 | Yoo |
| 2013/0334593 A1 | 12/2013 | Seol et al. |
| 2015/0311301 A1 | 10/2015 | Seol et al. |
| 2017/0092654 A1 | 3/2017 | Nishikawa et al. |
| 2017/0148800 A1 | 5/2017 | Nishikawa et al. |
| 2017/0345907 A1 | 11/2017 | Seol et al. |
| 2018/0261625 A1 | 9/2018 | Huo et al. |
| 2020/0258994 A1 | 8/2020 | Seol et al. |

* cited by examiner

TWO-STEP L-SHAPED SELECTIVE EPITAXIAL GROWTH

RELATED APPLICATION

This application is a bypass continuation of International Application No. PCT/CN2020/103963, filed on Jul. 24, 2020. The entire disclosure of the prior application is hereby incorporated by reference in its entirety.

BACKGROUND

Three dimensional (3D) NAND flash memory technology has been developed to achieve higher data storage density without requiring smaller memory cells. A 3D NAND memory device usually includes a stack of alternating word line layers and insulating layers, which are used to form memory cells that are stacked vertically. A 3D NAND memory device can further include a source connection layer below the stack to electrically connect the vertical memory cells to source regions.

Various fabrication technologies, such as sidewall selective epitaxial growth (SEG), have been developed to fabricate vertical memory devices. The sidewall SEG technology is also referred to as the SWS technology. During the fabrication of a semiconductor device, the SWS technology replaces a source sacrificial layer below a stack of layers, which can be used for forming vertical memory cell strings, with an epitaxial layer, which forms source connection for the vertical memory cell strings. Such an epitaxy layer can be formed in a single epitaxial process, but this technique can have poor control over the layer thickness and uniformity, and may even deform a gate line profile.

SUMMARY

The present disclosure provides a semiconductor device having a source connection layer that is formed by two selective epitaxial growth (SEG) processes and the method of forming the same.

According to a first aspect, a semiconductor device having an L-shaped source connection layer that is formed by two SEG processes is disclosed. The L-shaped source connection layer can have a first portion that extends parallel along a substrate of the device and a second portion that extends perpendicularly from the substrate. The two SEG processes can include a first SEG process to deposit an initial portion of the L-shaped source connection layer, and a second SEG process to complete the initial portion of the L-shaped source connection layer and deposit another portion of the L-shaped source connection layer.

The device can further include a channel structure that has a first portion extending through a stack and a second portion extending through and being in contact with the initial portion of the L-shaped source connection layer. The channel structure can further have a channel layer. The first portion of the channel structure can have a first portion of the channel layer and an insulating layer surrounding the first portion of the channel layer. The second portion of the channel structure can have a second portion of the channel layer that extends through and is in direct contact with the second portion of the L-shaped source connection layer. In some embodiments, the L-shaped source connection layer can serve as a common source line or electrically connect the channel layer to a source region of the semiconductor device.

The device can further include a gate line slit structure in the stack, a staircase region in the stack, and a contact structure in the staircase region. The contact structure can be electrically coupled with a word line layer to provide a control signal to the channel structure.

A second aspect of the disclosure provides a method of processing a semiconductor device including a stack that is formed over a source sacrificial layer above a substrate, a channel structure that extends vertically through the stack and the source sacrificial layer, a gate line cut trench that extends vertically through the stack, and a spacer layer that covers uncovered top and side surfaces of the stack. The stack can be formed of alternating insulating layers and sacrificial word line layers. The method can include exposing a lower sidewall of the channel structure by removing the source sacrificial layer. In some embodiments, exposing the lower sidewall can further include removing an oxide layer on the substrate and a lower oxide layer of the channel structure.

The method can also include forming a protection layer that has a first portion that covers the lower sidewall of the channel structure, a second portion that covers the substrate, and a third portion that covers the spacer layer. For example, the protection layer can be an oxide layer. In some embodiments, the first portion of the protection layer can be thinner than the second portion of the protection layer, and the second portion of the protection layer can be thinner than the third portion of the protection layer.

The method can also include exposing a channel layer of the channel structure by removing the first portion of the protection layer and an insulating layer of the channel structure. In some embodiments, a first etching process can be performed via the gate line cut trench to remove the first portion of the protection layer and partially remove the second and third portions of the protection layer, and a second etching process can be performed via the gate line cut trench to remove the insulating layer of the channel structure. Subsequently, an initial source connection layer can be formed over the exposed channel layer of the channel structure. For example, a first selective deposition process can be performed to deposit an initial source connection layer only on the exposed channel layers. Then, the method can include exposing the substrate by removing the second portion of the protection layer. In some embodiments, a third etching process can be performed via the gate line cut trench to remove the second portion of the protection layer and partially remove the third portion of the protection layer.

The method can further include forming a source connection layer over the initial source connection layer and the exposed substrate. In some embodiments, a second selective deposition process can be performed to deposit the source connection material only on the initial source connection layer and the exposed substrate. Further, the source connection layer can serve as a common source line or electrically connect the channel layer to a source region of the semiconductor device.

In some embodiments, the method can also include removing the third portion of the protection layer, removing the spacer layer, and replacing the sacrificial word line layers with word line layers. Additionally, a staircase region can be formed in the stack that includes a contact structure. The contact structure can be electrically coupled with the word line layer to provide a control signal to the channel structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1A:
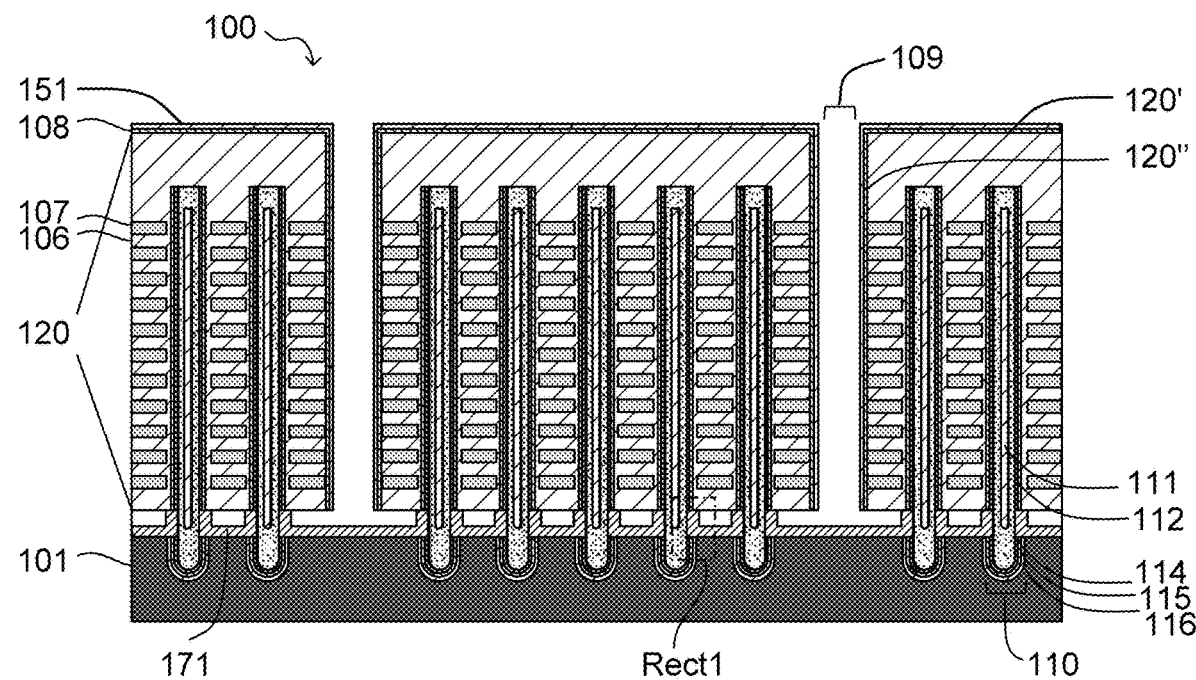
FIGS. 1A and 1B are cross-sectional views of a semiconductor device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 100 degrees or at other orientations) and the spatially relative descriptors used herein may likewise be interpreted accordingly.

The present disclosure provides a method of two-step SEG for SWS technology. The method can include forming a protection layer, removing a first portion of the protection layer, performing a first SEG process, removing a second portion of the protection layer, and performing a second SEG process. Consequently, an L-shaped source connection layer can be formed to connect vertical memory cell strings to source regions. Compared with related examples where a source connection layer is formed in a single step, the two-step SEG approach can provide control over both sidewall thickness and bottom thickness, improve layer uniformity, protect the gate line profile, and increase wafer acceptance rate.

FIG. 1A is a cross-sectional view of a semiconductor device 100, in accordance with exemplary embodiments of the disclosure. As shown, the device 100 can include a substrate 101 and a stack 120 that is arranged over the substrate 101. The device 100 can also include an L-shaped source connection layer 171 arranged between the substrate 101 and the stack 120.

The stack 120 can be formed of insulating layers 106 and sacrificial word line layers 107 that are alternatingly stacked above the substrate 101 in the Z direction. The stack 120 can also include one or more gate line cut trenches 109 that extend though the stack 120 in the Z direction. Additionally, a spacer layer 108 can be formed to cover top surfaces 120' and side surfaces 120" of the stack 120, and a protection layer 151 can be formed to cover the spacer layer 108.

As shown in FIG. 1A, the stack 120 can also include a plurality of channel structures 110 that vertically extend through the stack 120 and the source connection layer 171 in the Z direction. The channel structures 110 can be formed of numerous materials and have a circular cross-sectional shape in the X-Y plane. The channel structure 110 can include an insulating layer 111 (e.g., silicon oxide and/or air gap), a channel layer 112 (e.g., polysilicon or monocrystalline silicon) surrounding the insulating layer 111, a tunneling layer 114 (e.g., silicon oxide) surrounding the channel layer 112, a charge trapping layer 115 (e.g., silicon nitride) surrounding the tunneling layer 114, and a barrier layer 116 (e.g., silicon oxide) that surrounds the charge trapping layer 115 and is in direct contact with the sacrificial word line layers 107.

As describe in detail below, during manufacture, the source connection layer 171 can be formed by using two SEG processes to form an L-shaped source connection layer 171. Further, the source connection layer 171 can be made of a conductive metal or any suitable semiconductor material, such as polysilicon or monocrystalline silicon, and the semiconductor material may be un-doped or may include a p-type or n-type dopant. In some embodiments, the source connection layer 171 can be a common source line for a plurality of vertical memory cell strings, and can therefore be referred to as a common source layer.

Additionally, the substrate 101 can be silicon in this example. The substrate 101 can also be any other suitable substrate, such as a germanium (Ge) substrate, a silicon-germanium (SiGe) substrate, and/or a silicon-on-insulator (SOI) substrate. The substrate 101 may include a semiconductor material, for example, a Group IV semiconductor, a Group III-V compound semiconductor, or a Group II-VI oxide semiconductor. The Group IV semiconductor may include Si, Ge, or SiGe. The substrate 101 may be a bulk wafer or an epitaxial layer.

In an exemplary embodiment, the barrier layer 116 can be made of a same material as and integrally formed with the insulating layers 106. Further, in some embodiments, a high-K layer such as $HfO_2$ or $Al_2O_3$ can be deposited between the barrier layer 116 and the sacrificial word line layers 107 (not shown). Moreover, while the channel structures 110 are shown to extend into the substrate 101 in the FIG. 1A example, the channel structures 110 can be on or above the substrate 101 in other embodiments.

Figure 1B:
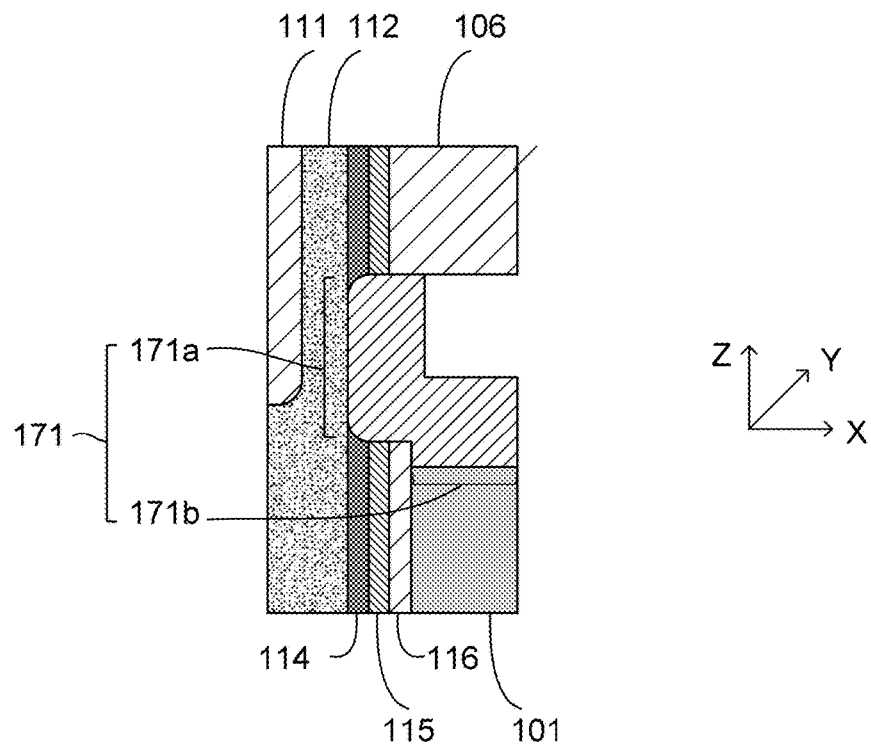

FIG. 1B is an expanded view of the rectangle Rect1 in FIG. 1A. Specifically, FIG. 1B shows an expanded view of the L-shaped source sacrificial layer 171. As shown, a first portion of the source connection layer 171a can extend perpendicularly from the substrate 101, and a second portion of the source connection layer 171b can extend parallel along the substrate 101. As a result, the first portion of the source connection layer 171a and the second portion of the source connection layer 171b together form the L-shaped source connection layer 171. Further, the source connection layer 171 can be in direct contact with channel layers 112 and electrically connect channel layers 112 of the stack 120 to one or more source regions in the device 100 (not shown).

FIGS. 2, 3, 4, 5A, 5B, 6A, 6B, 7A, 7B, 8, 9A, and 9B are cross-sectional views of a semiconductor device, such as the device 100 and the like, at various intermediate steps of manufacturing, in accordance with exemplary embodiments of the disclosure. The device 100 can refer to any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like.

Figure 2:
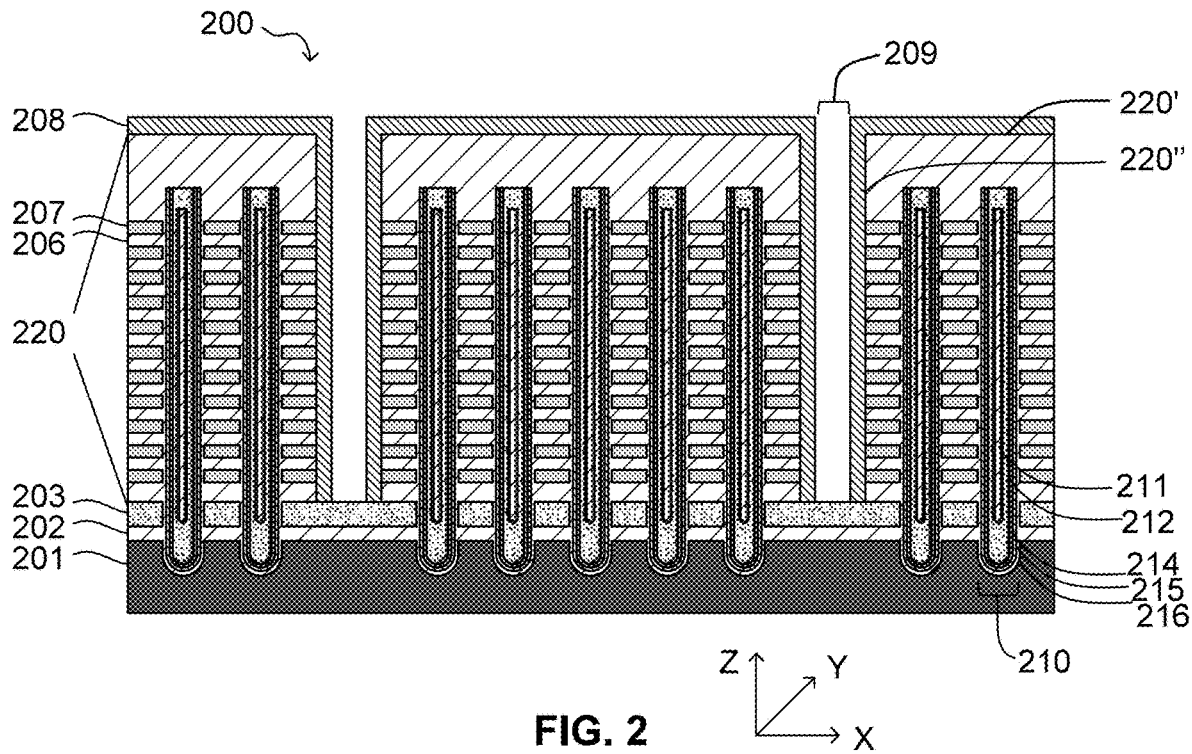
FIGS. 2, 3, 4, 5A, 5B, 6A, 6B, 7A, 7B, 8, 9A, 9B are cross-sectional views of a semiconductor device at various intermediate steps of manufacturing, in accordance with exemplary embodiments of the disclosure.

FIG. 2 shows a cross-sectional view of a semiconductor device 200 that will eventually become the device 100. Since the example embodiment of the device 200 in FIG. 2 is similar to the example embodiment of the device 100 in FIG. 1A, explanation will be given with emphasis placed upon differences. As shown, the device 200 can include a substrate 201 (e.g., silicon), an oxide layer 202 (e.g., silicon oxide) over the substrate 201, and a source sacrificial layer 203 (e.g., polysilicon) over the oxide layer 202.

In some embodiments, the source sacrificial layer 203 can be formed of a plurality of suitable sacrificial layers. For example, the source sacrificial layer 203 can include a silicon oxide layer, a silicon nitride layer, a polysilicon layer, a silicon nitride layer, and a silicon oxide layer from bottom to top, where the polysilicon layer is sandwiched between two silicon nitride layers and then two silicon oxide layers. In some embodiments, the source sacrificial layer 203 can be in direct contact with the substrate 201 with no oxide layer in between (not shown). Further, in some examples, the device 200 can include an etch stop layer on the source sacrificial layer 203 (not shown).

The device 200 can also include a stack 220 that corresponds to the stack 120 in FIG. 1A. The stack 220 can be formed of alternating insulating layers 206 and sacrificial word line layers 207. The stack can also include one or more gate line cut trenches 209 that extend through the stack 220. A spacer layer 208 can be disposed to cover top surfaces 220' and side surfaces 220" of the stack 220. The stack can further include a plurality of channel structures 210 that extend though the stack 220 and the source sacrificial layer 203. Similar to the channel structures 110 in FIG. 1A, the channel structure 210 can include an insulating layer 211, a channel layer 212, a tunneling layer 214, a charge trapping layer 215, and a barrier layer 216.

Figure 3:
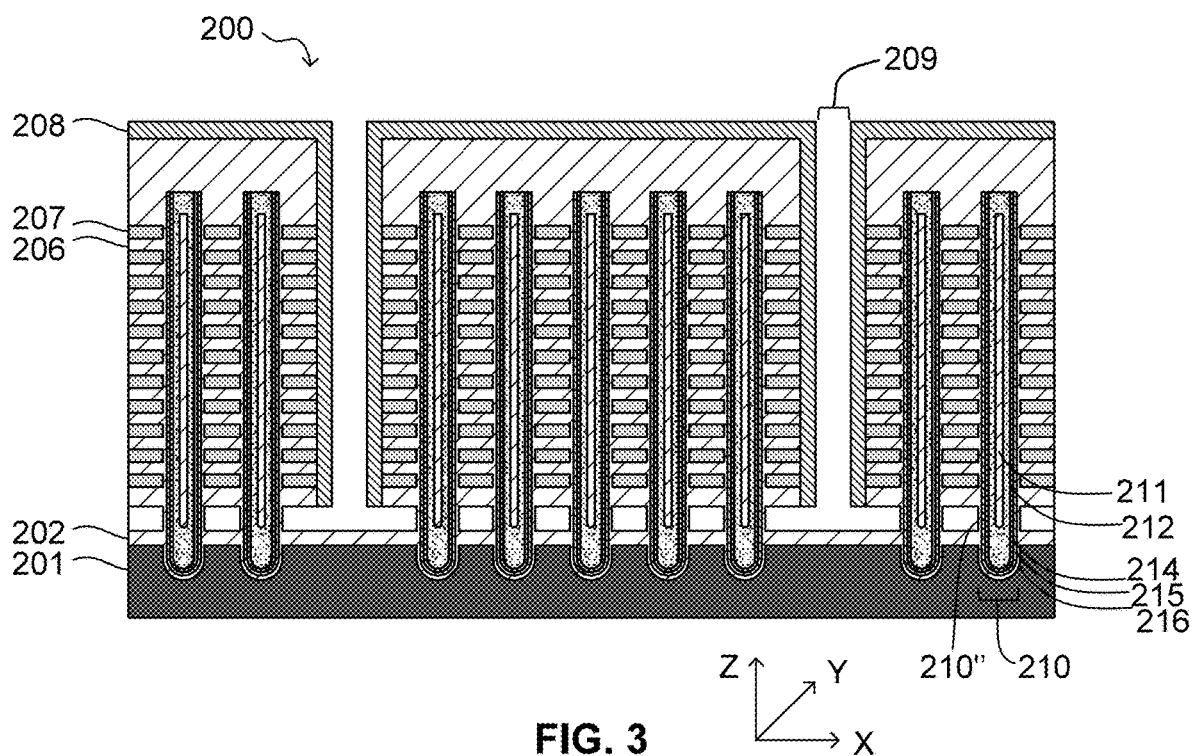

FIG. 3 shows the device 200 in FIG. 2 after removing the source sacrificial layer 203 to expose lower sidewalls 210" of the channel structures 210. Removal of the source sacrificial layer 203 can be accomplished by any etching process via the gate line cut trench 209. For example, an etchant can be selected so that the etchant only etches the source sacrificial layer 203 but does not etch the spacer layer 208 or the oxide layer 202. For example, the etchant can be a solution containing tetramethylammonium hydroxide (TMAH) that etches polysilicon, but does not etch silicon nitride or silicon oxide.

Figure 4:
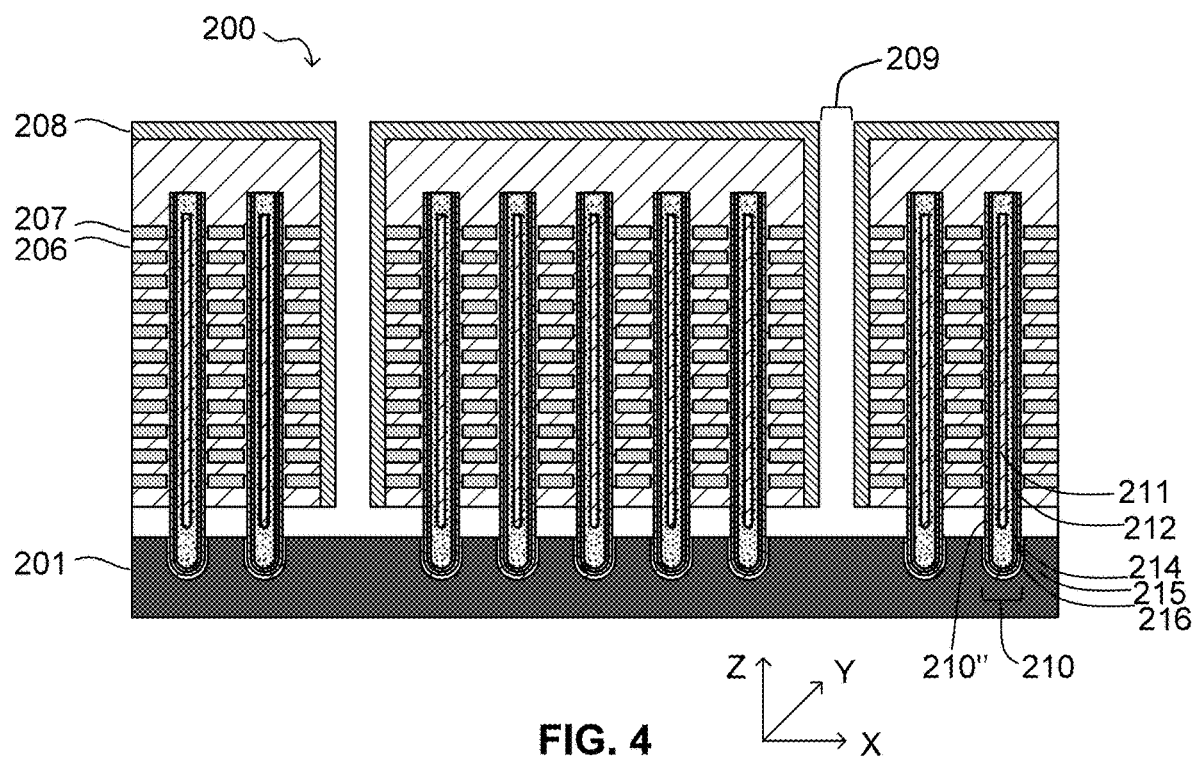

FIG. 4 shows the device 200 in FIG. 3 after removing the oxide layer 202, which can be accomplished by any technique, such as a wet etching process via the gate line cut trench 209. An etchant can be selected so that the etchant only etches the oxide layer 202 but does not etch the spacer layer 208 or the substrate 201. For example, the etchant can be a solution containing hydrofluoric acid (HF) that etches silicon oxide, but does not etch silicon nitride or silicon. Note that a lower portion of the barrier layer 216 can also be removed in this process since the barrier layer 216 can be silicon oxide. In some embodiments, the insulating layers 206 can also be silicon oxide so the bottom insulating layer 206 can be partially removed (not shown).

Figure 5A:
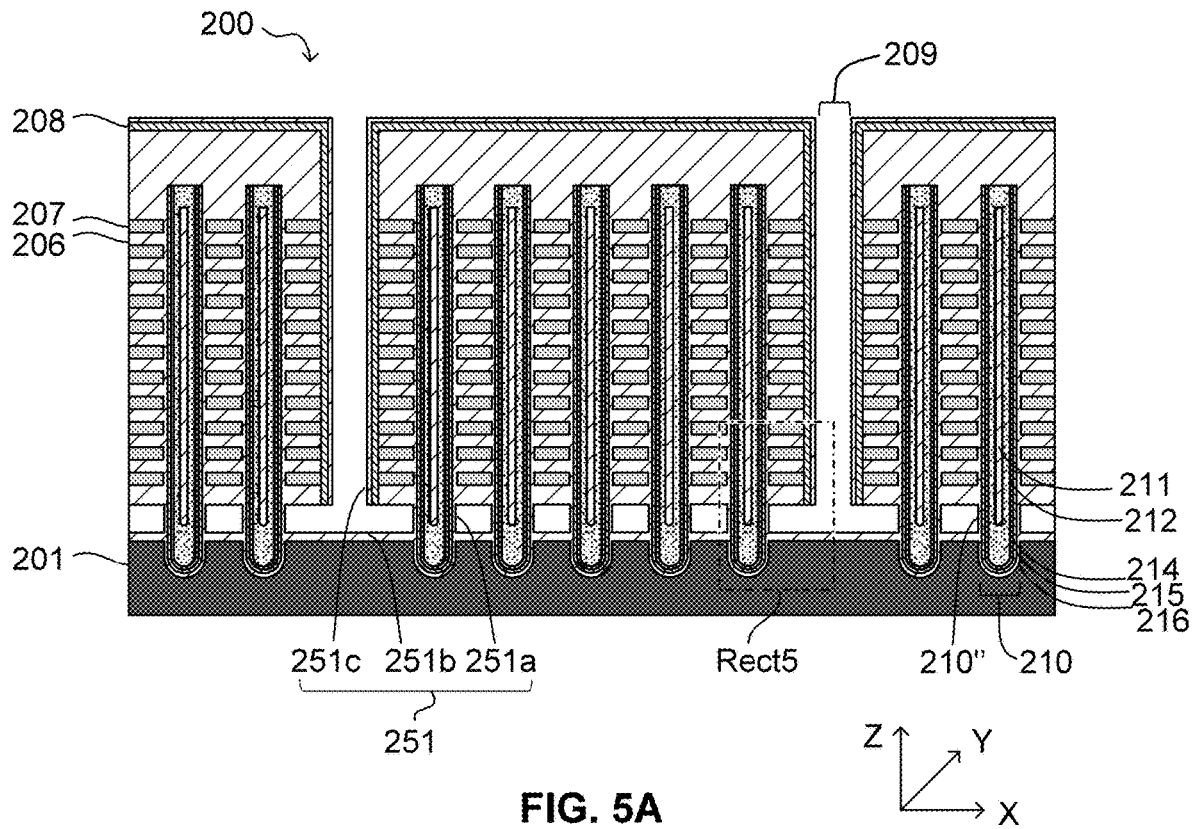

In FIG. 5A, a protection layer 251 can be formed on all uncovered surfaces. Specifically, a first portion of the protection layer 251a can be formed on the exposed lower sidewalls 210" of the channel structures 210. A second portion of the protection layer 251b can be formed on the substrate 201, and a third portion of the protection layer 251c can be formed on the spacer layer 208. As shown, the first portion of the protection layer 251a can be thinner than the second portion of the protection layer 251b, and the second portion of the protection layer 251b can be thinner than the third portion of the protection layer 251c. For example, the first, second, and third portions of the protection layer 251a, 251b, and 251c can have a thickness in the range of 2-3 nm, 15-25 nm, and 20-40 nm, respectively. Moreover, the protection layer 251 can be silicon oxide formed by a wet thermal oxidation process.

Figure 5B:
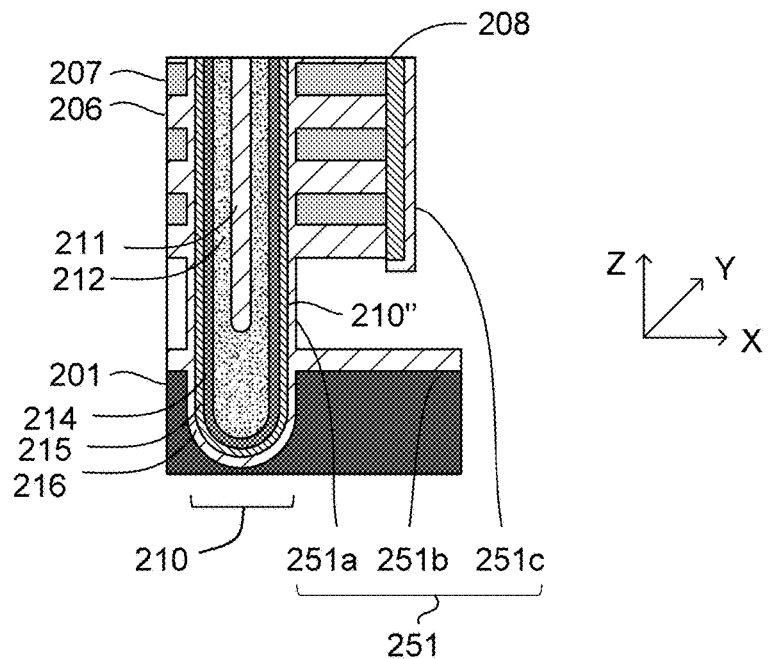

FIG. 5B is an expanded view of the rectangle Rect5 in FIG. 5A, further illustrating a bottom of the gate line cut trench 209 and the channel structure 210. As can be seen in greater detail, the protection layer 251 can be formed on all uncovered surfaces. Particularly, the first, second, and third portions of the protection layer 251a, 251b, and 251c can cover the exposed lower sidewalls 210" of the channel structures 210, the substrate 201, and the spacer layer 208, respectively. Note that the first portion of the protection layer 251a can be thinner than the second portion of the protection layer 251b, and that the second portion of the protection layer 251b can be thinner than the third portion of the protection layer 251c.

Figure 6A:
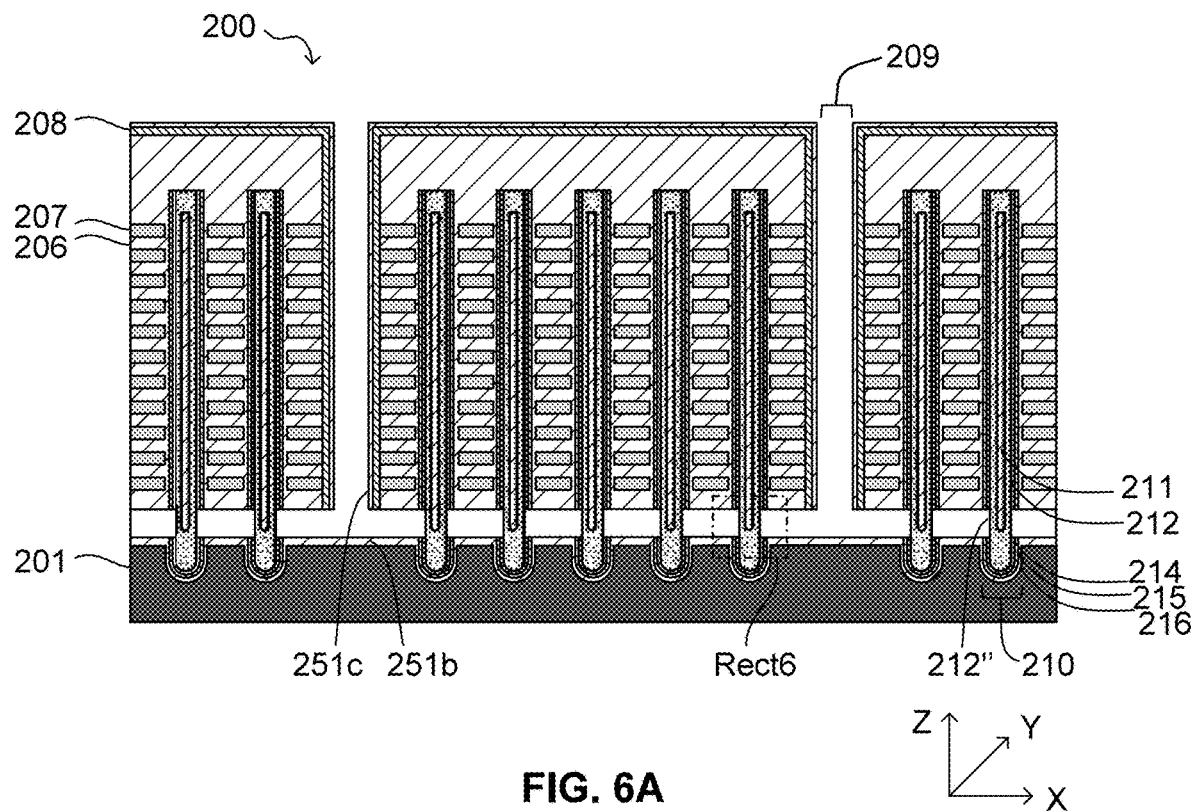

FIG. 6A shows the device 200 in FIG. 5A after a lower sidewall 212" of the channel layer 212 of the channel structure 210 is exposed. Firstly, the first portion of the protection layer 251a can be removed. Similar to FIG. 3, removal of the first portion of the protection layer 251a can be achieved by a wet etching process via the gate line cut trench 209 using HF. As mentioned above in FIG. 5A, the second portion of the protection layer 251b and the third portion of the protection layer 251c can be thicker than the first portion of the protection layer 251a. Consequently, the second portion of the protection layer 251b and the third portion of the protection layer 251c can be removed partially.

Next, a lower portion of the tunneling layer 214 and a lower portion of the charge trapping layer 215 can be removed. Consequently, a lower sidewall 212" of the channel layer 212 can be exposed. Removing the tunneling layer 214 and the charge trapping layer 215 can be accomplished by two separate etching processes. In some embodiments, the tunneling layer 214 and the charge trapping layer 215 can be formed in a bicyclic process so that their chemical compositions are close enough to be removed in a single etching process.

Figure 6B:
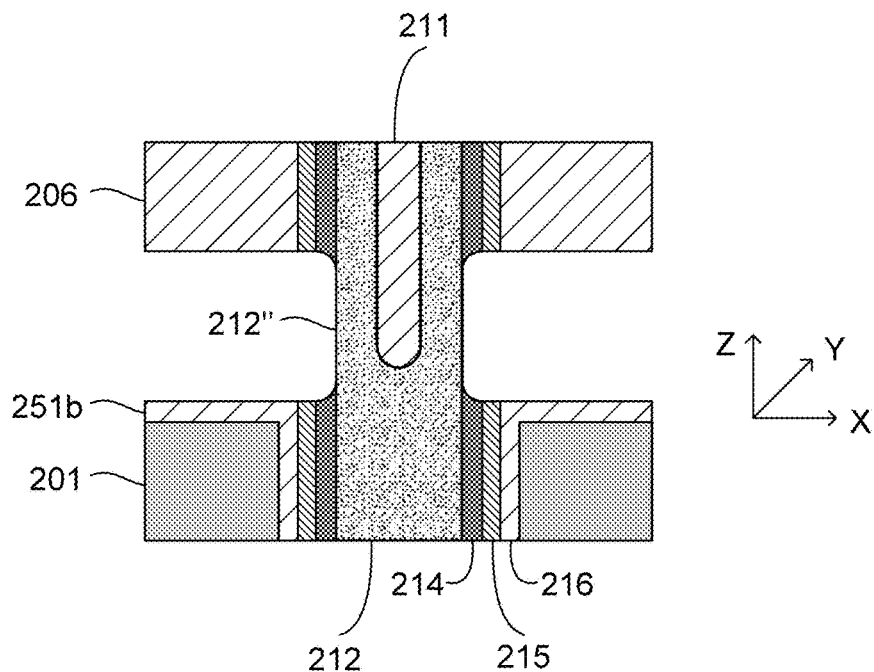

FIG. 6B is an expanded view of the rectangle Rect6 in FIG. 6A. As shown, the first portion of the protection layer 251a in FIGS. 5A and 5B has been removed while the second portion of the protection layer 251b can be removed partially and remain on the substrate 201. Consequently, the lower sidewall 212" of the channel layer 212 can be exposed. While not shown, it is understood that the third portion of the protection layer 251c can also be removed partially and remain on the spacer layer 208.

Figure 7A:
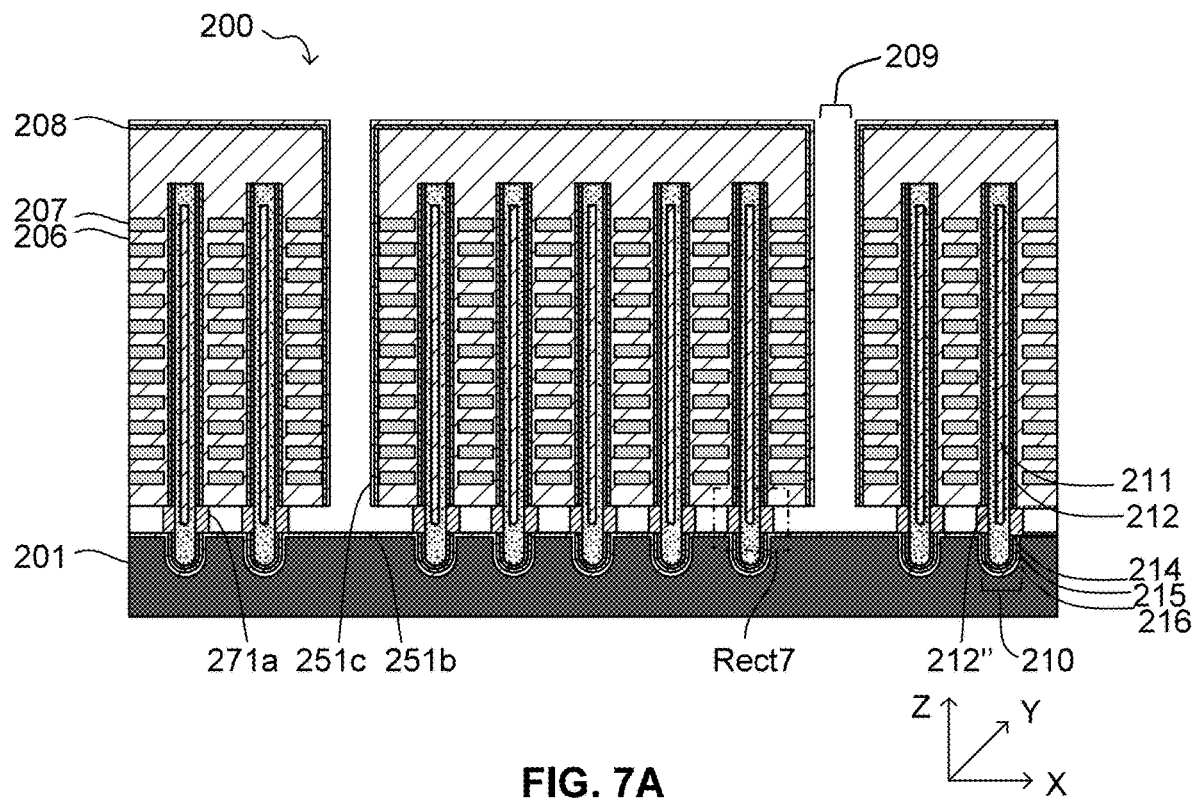

In FIG. 7A, a first portion of the source connection layer 271a can initially be formed on the exposed lower sidewalls 212" of the channel layers 212. The formation of the first portion of the source connection layer 271a can be accomplished by a first SEG process that only deposits a source connection material on the exposed lower sidewalls 212" of the channel layers 212. As shown, the first portion of the source connection layer 271a can extend perpendicular to the substrate 201 along the lower sidewalls 212" of the channel layer 212. The first portion of the source connection layer 271a can be a conductive metal or any semiconductor material, such as polysilicon or monocrystalline silicon, and the semiconductor material may be un-doped or may include a p-type or n-type dopant.

Figure 7B:
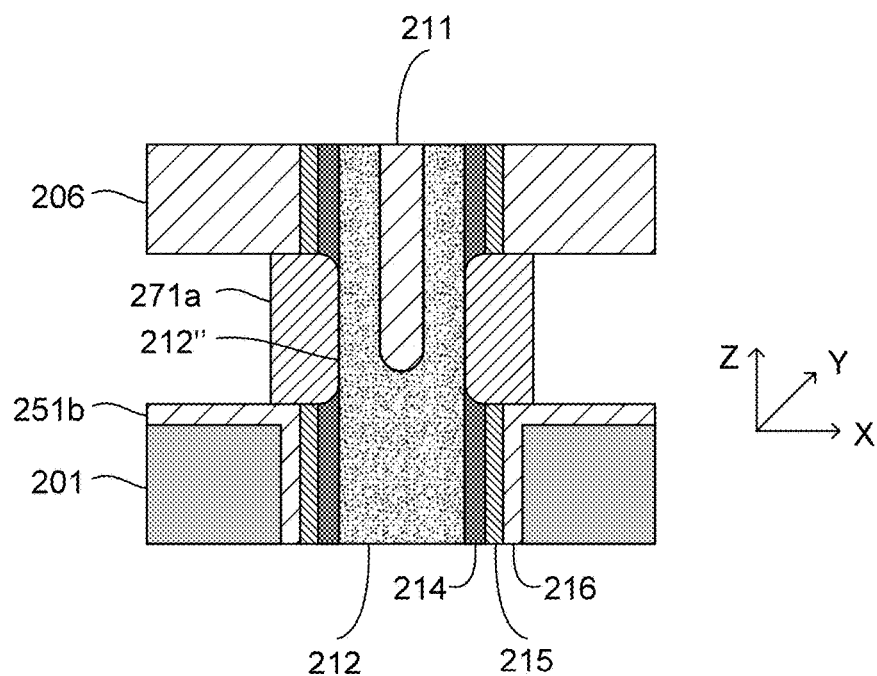

FIG. 7B is an expanded view of the rectangle Rect7 in FIG. 7A. As illustrated, the first portion of the source connection layer 271a can be formed to cover the lower sidewalls 212" of the channel layers 212. The conditions of the first SEG process can be controlled so that the first portion of the source connection layer 271a can grow to a predetermined initial thickness.

Figure 8:
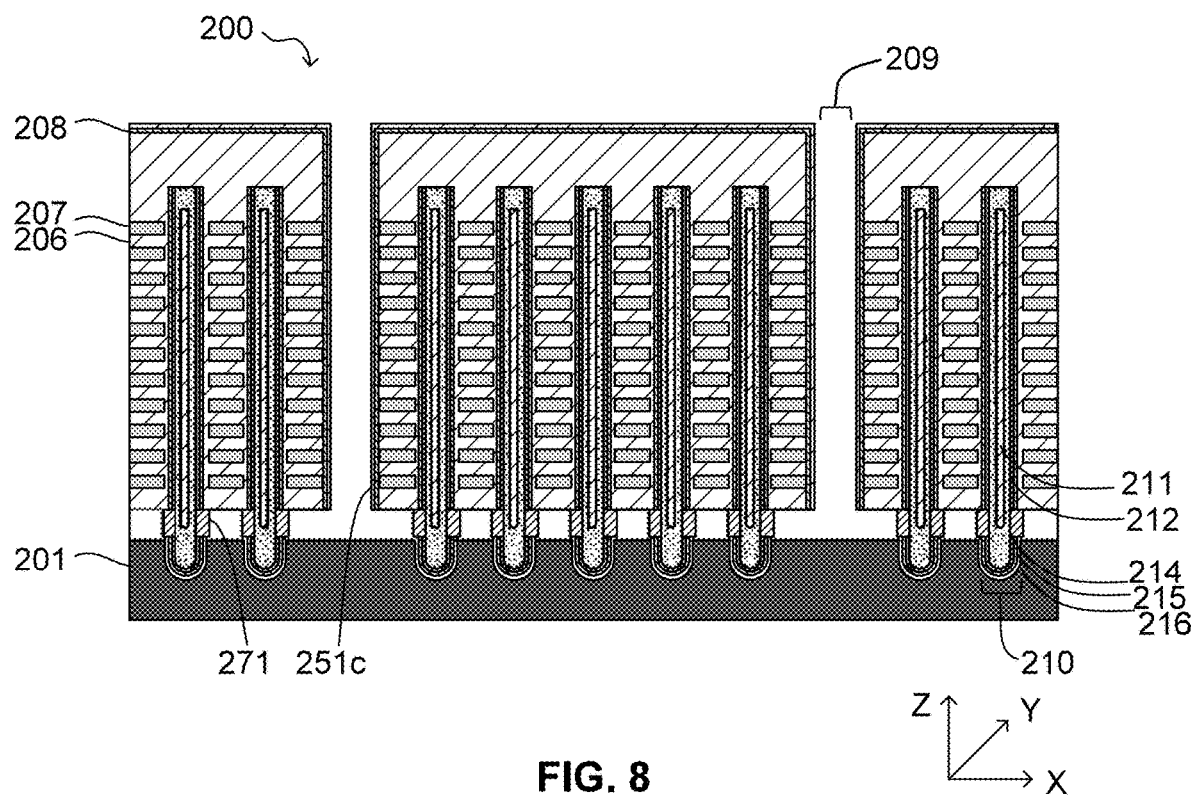

FIG. 8 shows the device 200 in FIG. 7A after removing the second portion of the protection layer 251b. Consequently, the substrate 201 can be exposed. Similar to FIGS. 3 and 5A, removal of the second portion of the protection layer 251b can be achieved by a wet etching process via the gate line cut trench 209 using HF. As mentioned above in FIG. 5A, the third portion of the protection layer 251c can be thicker than the second portion of the protection layer 251b. As a result, the third portion of the protection layer 251c can be removed partially.

Figure 9A:
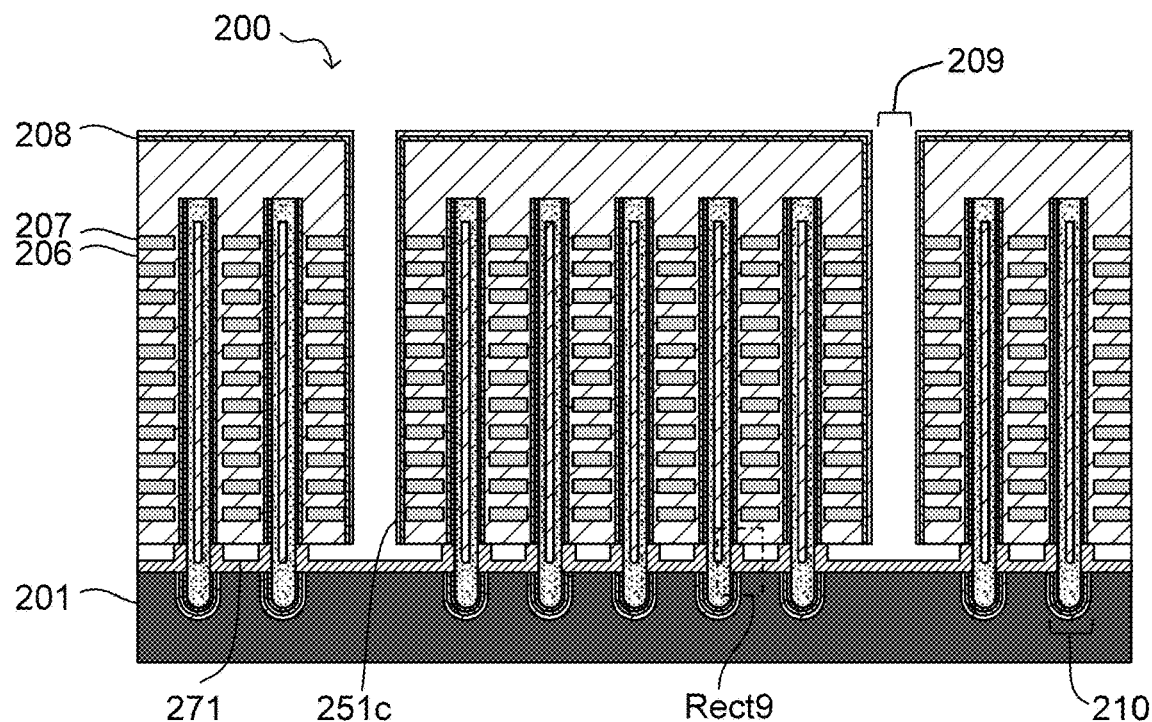
Figure 9B:
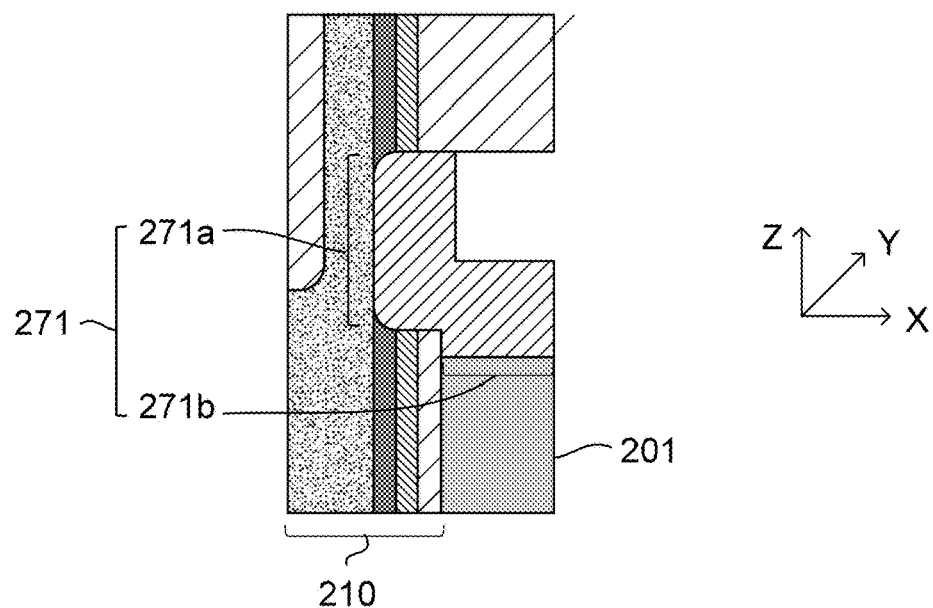

In FIGS. 9A and 9B, a second portion of the source connection layer 271b can be formed on the first portion of the source connection layer 271a and extend along the exposed substrate 201. Similar to FIG. 6A, the formation of the second portion of source connection layer 271b can be a second SEG process that deposits the source connection material only on the initial first portion of the source connection layer 271a and the exposed substrate 201. Consequently, the source connection layer 271 can have an L shape. Further, the source connection layer 271 can electrically connect channel layers 212 to one or more source regions in the device 200 (not shown). In some embodiments, the source connection layer 271 can be a common source line for a plurality of vertical memory cell strings, and can therefore be referred to as a common source layer.

FIG. 9B is an expanded view of the rectangle Rect9 in FIG. 9A. As illustrated, the second portion of the L-shaped source connection layer 271b can be formed on the substrate 201 and merge with the first portion of the L-shaped source connection layer 271a. The conditions of the second SEG process can be controlled so that the first portion of the source connection layer 271a and the second portion of the source connection layer 271b can both reach predetermined thicknesses.

Figure 10:
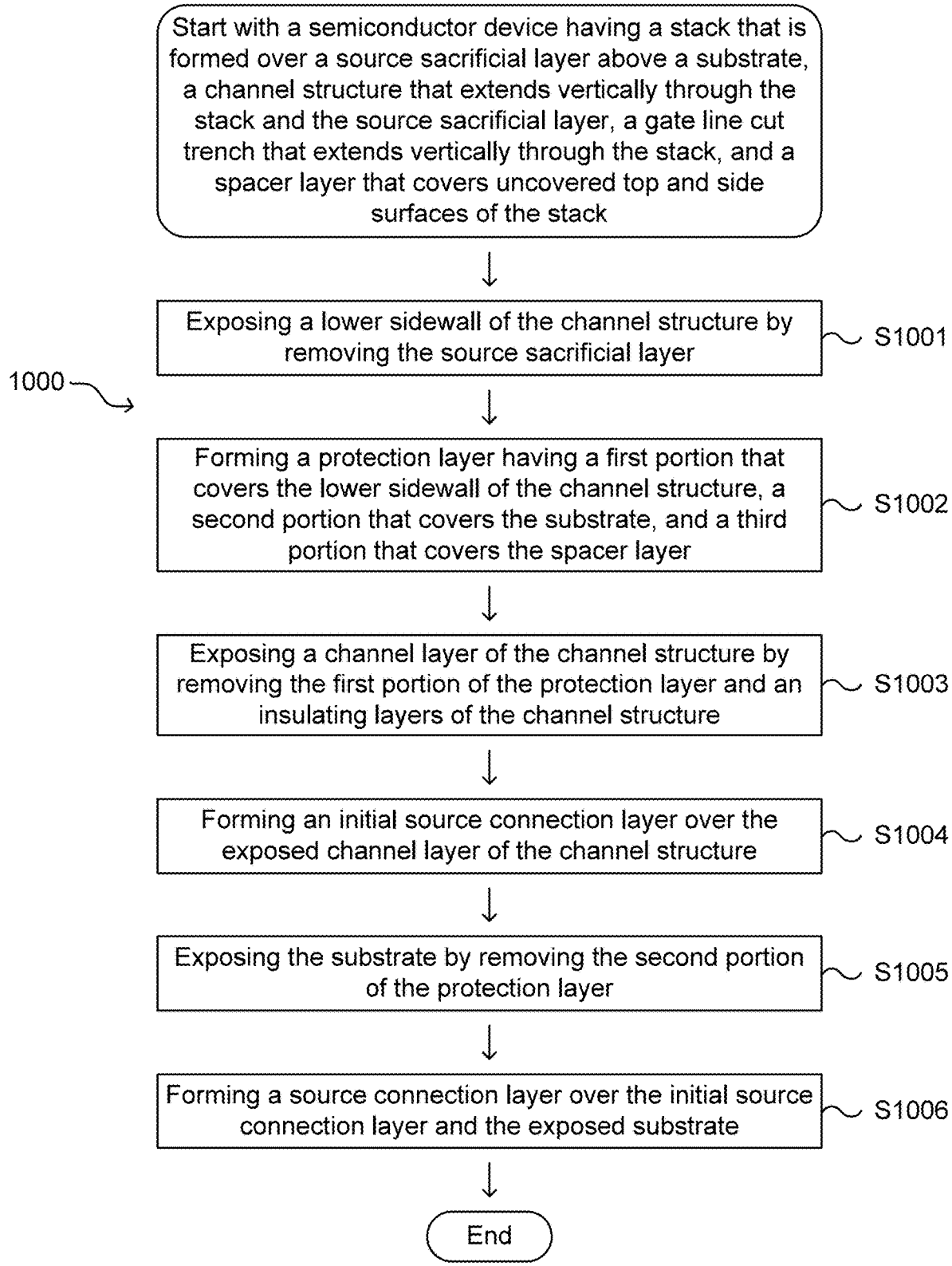
FIG. 10 is a flow chart of an exemplary process for manufacturing an exemplary semiconductor device, in accordance with embodiments of the disclosure.

FIG. 10 is a flow chart of an exemplary process 1000 for manufacturing an exemplary semiconductor device, such as the device 100 in FIG. 1A, the device 200 in FIG. 9A, and the like, in accordance with embodiments of the disclosure. The process 1000 can start with a semiconductor device having a stack that is formed over a source sacrificial layer above a substrate, a channel structure that extends vertically through the stack and the source sacrificial layer, a gate line cut trench that extends vertically through the stack, and a spacer layer that covers uncovered top and side surfaces of the stack. The stack can include alternating insulating layers and sacrificial word line layers that are used to form transistors, such as dummy bottom select transistors, bottom select transistors, memory cell transistors, top select transistors, and the like. The channel structure can include a channel layer surrounded by one or more insulting layers, such as a tunneling layer, a charge trapping layer, and a barrier layer sequentially. In some embodiments, an oxide layer can be sandwiched between the source sacrificial layer and the substrate, and the barrier layer can also be oxide layer.

At step S1001, a lower sidewall of the channel structure can be exposed by removing the source sacrificial layer. This can be accomplished by an etching process via the gate line cut trench. In an example where an oxide layer is sandwiched between the source sacrificial layer and the substrate, and the barrier layer is also an oxide layer, exposing the lower sidewall of the channel structure can further include removing the oxide layer and a lower portion of the barrier layer by another etching process via the gate line cut trench.

At step S1002, a protection layer can be formed so that a first portion of the protection layer covers the lower sidewall of the channel structure, a second portion of the protection layer covers the substrate, and a third portion of the protection layer covers the spacer layer. Particularly, the first portion of the protection layer can be thinner than the second portion of the protection layer, and the second portion of the protection layer can be thinner than the third portion of the protection layer.

At step S1003, a lower sidewall of the channel layer can be exposed by removing the first portion of the protection layer and the one or more insulating layers surrounding the channel layer. A first etching process can be applied via the gate line cut trench to remove the first portion of the protection layer. Meanwhile, the second and third portions of the protection layer can be partially removed. Next, a second etching process can be applied via the gate line cut trench to remove the insulating layers surrounding the channel layer. In some embodiments, the barrier layer can be removed at step S1002, and the tunneling layer and the charge trapping layer can be removed at step S1003.

At step S1004, a first portion of the source connection layer can initially be formed over the exposed lower sidewall of the channel layer. A first sidewall SEG process can be performed to grow an epitaxial layer of source connection material, such as doped silicon, doped polysilicon, doped amorphous and the like, only on the exposed lower sidewall of the channel layer. The source connection material can therefore be in direct contact with the channel layer which is used for forming channels of the memory cells and select transistors.

At step 1005, the substrate can be exposed by removing the second portion of the protection layer. Similar to the first etching process, a third etching process can be applied via the gate line cut trench to remove the second portion of the protection layer. Meanwhile, the third portion of the protection layer can be partially removed.

At step S1006, an L-shaped source connection layer can be formed on the first portion of the source connection layer and the substrate. Similar to the first SEG process, a second SEG process can be performed to grow an epitaxial layer of the source connection material only on the first portion of the source connection layer and the substrate. Consequently, a second portion of the source connection layer can be formed in direct contact with and extend parallel along the substrate. The second portion of the source connection layer can merge with the first portion of the source connection layer to form an L-shaped source connection layer. The thicknesses of the first and second portions of the L-shaped source connection layer can be controlled by the two SEG processes. In some embodiments, one or more source regions can be disposed in the substrate. Hence, the L-shaped source connection layer can electrically connect the channel layer(s) to the one or more source regions of the semiconductor device. In some embodiments, the L-shaped source connection layer can serve as a common source line for a plurality of vertical memory cell strings, and can therefore form an array common source.

It should be noted that additional steps can be provided before, during, and after the process 1000, and some of the steps described can be replaced, eliminated, or performed in a different order for additional embodiments of the process 1000. For example, after step S1006, the third portion of the protection layer and the spacer layer can be removed sequentially. Then, the sacrificial word line layers can be replaced with word line layers. Moreover, a staircase region can be formed in the stack, and a contact structure can be formed in the staircase region. The contact structure can be electrically coupled with a word line layer to provide a control signal to the channel structure.

The various embodiments described herein offer several advantages. For example, the sidewall and bottom thicknesses of the L-shaped source sacrificial layer can be tuned separately by the two SEG processes. Hence, the uniformity of the L-shaped source sacrificial layer can be improved, and the wafer acceptance rate can be increased accordingly. Moreover, the processing window for where the horizontal and vertical portions of the L-shaped source sacrificial layer merge can be expanded to allow for more variation from device to device. Compared with related examples where the spacer is NON (nitride-oxide-nitride), the new spacer here can be a single nitride layer of a reduced thickness, which facilitates etching via the gate line cut trench and protects the gate line profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of processing a semiconductor device having a stack that is formed over a source sacrificial layer above a substrate, a channel structure that extends vertically through the stack and the source sacrificial layer, a gate line cut trench that extends vertically through the stack, and a spacer layer that covers uncovered top and side surfaces of the stack, comprising:
    exposing a lower sidewall of the channel structure by removing the source sacrificial layer;
    forming a protection layer having a first portion that covers the lower sidewall of the channel structure, a second portion that covers the substrate, and a third portion that covers the spacer layer;
    exposing a channel layer of the channel structure by removing the first portion of the protection layer and an insulating layer of the channel structure;
    forming an initial source connection layer over the exposed channel layer of the channel structure;
    exposing the substrate by removing the second portion of the protection layer; and
    forming a source connection layer over the initial source connection layer and the exposed substrate.

2. The method of claim 1, wherein:
    the first portion of the protection layer is thinner than the second portion of the protection layer; and
    the second portion of the protection layer is thinner than the third portion of the protection layer.

3. The method of claim 1, wherein removing the first portion of the protection layer and the insulating layer of the channel structures comprises:
    a first etching process via the gate line cut trench to remove the first portion of the protection layer and partially remove the second and third portions of the protection layer; and
    a second etching process via the gate line cut trench to remove the insulating layer of the channel structure.

4. The method of claim 3, wherein removing the second portion of the protection layer comprises:
    performing a third etching process via the gate line cut trench to remove the second portion of the protection layer and partially remove the third portion of the protection layer.

5. The method of claim 1, wherein forming an initial source connection layer over the exposed channel layer of the channel structure is performed by a first selective deposition process that deposits an initial source connection layer only on the exposed channel layers.

6. The method of claim 5, wherein forming the source connection layer over the initial source connection layer and the exposed substrate is performed by a second selective deposition process that deposits the source connection material only on the initial source connection layer and the exposed substrate.

7. The method of claim 1, wherein the source connection layer serves as a common source line or electrically connects the channel layer to a source region of the semiconductor device.

8. The method of claim 1, wherein exposing a lower sidewall of the channel structure further comprises:
    removing an oxide layer on the substrate and a lower oxide layer of the channel structure.

9. The method of claim 1, wherein the protection layer is an oxide layer.

10. The method of claim 1, wherein the stack comprises alternating insulating layers and sacrificial word line layers.

11. The method of claim 10, further comprising:
    removing the third portion of the protection layer;
    removing the spacer layer; and
    replacing the sacrificial word line layers with word line layers.

12. The method of claim 11, further comprising:
    forming a staircase region in the stack; and
    forming a contact structure in the staircase region, the contact structure electrically coupled with a word line layer to provide a control signal to the channel structure.

* * * * *